(12) United States Patent
Tomita

(10) Patent No.: US 11,864,308 B2
(45) Date of Patent: Jan. 2, 2024

(54) SUBSTRATE AND ANTENNA MODULE

(71) Applicant: Fujikura Ltd., Tokyo (JP)

(72) Inventor: Michikazu Tomita, Sakura (JP)

(73) Assignee: FUJIKURA LTD., Tokyo (JP)

( * ) Notice: Subject to any disclaimer, the term of this patent is extended or adjusted under 35 U.S.C. 154(b) by 464 days.

(21) Appl. No.: 17/268,170

(22) PCT Filed: Aug. 24, 2020

(86) PCT No.: PCT/JP2020/031816
§ 371 (c)(1),
(2) Date: Feb. 12, 2021

(87) PCT Pub. No.: WO2021/145015
PCT Pub. Date: Jul. 22, 2021

(65) Prior Publication Data
US 2022/0117078 A1   Apr. 14, 2022

(30) Foreign Application Priority Data

Jan. 16, 2020 (JP) .................................. 2020-005342

(51) Int. Cl.
*H01Q 1/38* (2006.01)
*H05K 1/02* (2006.01)
(Continued)

(52) U.S. Cl.
CPC ............. *H05K 1/0237* (2013.01); *H01Q 1/12* (2013.01); *H05K 1/115* (2013.01)

(58) Field of Classification Search
CPC ...... H05K 1/0237; H05K 1/115; H05K 1/181; H05K 2201/09809; H05K 2201/10545;
(Continued)

(56) References Cited

U.S. PATENT DOCUMENTS 5,331,514 A * 7/1994 Kuroda ............. H01L 23/49827
439/91

FOREIGN PATENT DOCUMENTS

JP   5-041463 A    2/1993
JP   2000-216630 A   8/2000
(Continued)

OTHER PUBLICATIONS

International Search Report dated Nov. 17, 2020, issued in counterpart application No. PCT/JP2020/031816 (2 pages).

*Primary Examiner* — David E Lotter
(74) *Attorney, Agent, or Firm* — WHDA, LLP

(57) ABSTRACT

A substrate includes, two first through-holes to which high-frequency signals are transmitted and which are arranged side by side so as to have a predetermined distance, and at least three reference potential second through-holes arranged side by side so as to have an distance smaller than the predetermined distance with respect to the two first through-holes. Among three of the second through-holes, one of the second through-holes is arranged in a region between the two first through-holes, and other two of the second through-holes are arranged in a region other than the region between the first through-holes such that one of the other two second through-holes is arranged side by side with respect to one of the two first through-holes, and the other of other two second through-holes is arranged side by side with respect to the other of the two first through-holes.

15 Claims, 5 Drawing Sheets

(51) Int. Cl.
  *H01Q 1/12* (2006.01)
  *H05K 1/11* (2006.01)
(58) Field of Classification Search
  CPC ....... H05K 2201/10734; H05K 1/0251; H05K
        1/116; H01P 1/00; H01P 1/04; H01Q
        1/12; H01Q 21/061; H01Q 1/38; H01L
                                     23/12
  See application file for complete search history.

(56) References Cited

FOREIGN PATENT DOCUMENTS

| | | |
|---|---|---|
| JP | 2003-100941 A | 4/2003 |
| JP | 2005-056961 A | 3/2005 |
| JP | 2006-229072 A | 8/2006 |

* cited by examiner

`US 11,864,308 B2`

SUBSTRATE AND ANTENNA MODULE

TECHNICAL FIELD

The present invention relates to a substrate and an antenna module.

This application is a National Stage Application filed under 35 U.S.C. § 371 of International Application No. PCT/JP2020/031816 filed on Aug. 24, 2020 which claims the benefit of priority under 35 U.S.C. § 119(a) of Japanese Patent Application No. 2020-005342 filed on Jan. 16, 2020, the contents of which are incorporated herein by reference.

BACKGROUND ART

Through-holes having a coaxial structure may be formed on a substrate to which a high-frequency signal such as a millimeter wave is transmitted. This is to reduce the transmission loss of the high-frequency signal transmitted through the through-holes as much as possible by performing impedance matching of the through-holes. Patent Document 1 described below discloses a through-hole formed as a pseudo-coaxial structure by surrounding a through-hole to which the high-frequency signal is transmitted (via-hole conductor) with a number of through-holes of ground potential (via-hole conductors).

PRIOR ART

Patent Document

[Patent Document 1] Japanese Unexamined Patent Application, First Publication No. 2003-100941

DISCLOSURE OF INVENTION

Problems to be Solved by the Invention

Recently, in a high-frequency integrated circuit which is mounted on a substrate (Radio Frequency Integrated Circuits: RFIC), the pitch becomes narrow and it is expected that the pitch will become narrower in the future. Along with this, the pitch of the through holes formed on the substrate is also required to be narrowed. Accordingly, the through-holes disclosed in Patent Document 1 described above are not suitable for narrowing the pitch because the through-hole through which a high-frequency signal is transmitted is surrounded by through-holes of the ground potential in a ring-shape manner.

The present invention has been made in view of the above circumstances, and provides a substrate capable of arranging impedance-matched through-holes at a higher density than the conventional one, and an antenna module including the substrate.

Means for Solving the Problems

In a first aspect of the present invention, a substrate (30) in which a through-hole is formed from a first surface (30a) to a second surface (30b) which is a surface opposite to the first surface, the substrate includes, two first through-holes (31a) to which high-frequency signals are transmitted and which are arranged side by side so as to have a predetermined distance, and at least three reference potential second through-holes (31b) arranged side by side so as to have an distance smaller than the predetermined distance with respect to the two first through-holes. Among three of the second through-holes, one of the second through-holes is arranged in a region (R1) between the two first through-holes, and other two of the second through-holes are arranged in a region other than the region between the first through-holes such that one of the other two second through-holes is arranged side by side with respect to one of the two first through-holes, and the other of other two second through-holes is arranged side by side with respect to the other of the two first through-holes.

In the substrate according to the first aspect of the present invention, one of at least three second through-holes arranged side by side with respect to the two first through-holes to which a high-frequency signal is transmitted is arranged between the two first through-holes. As a result, the one second through-hole can be shared by the two first through-holes and the distance between the two first through-holes can be small. Therefore, the impedance-matched through-holes can be arranged at higher density than before.

In a second aspect of the present invention, in the substrate according to the first aspect described above, it is preferable that the second through-hole arranged in the region between the two first through-holes be arranged at a position substantially equidistant from each of the first through-holes.

In a third aspect of the present invention, in the substrate according to the first or second aspect described above, it is preferable that the second through-hole arranged in the region between the two first through-holes be arranged on a straight line (L1) connecting the centers of the first through-holes.

In a fourth aspect of the present invention, in the substrate according to any one of the first to third aspect described above, it is preferable that the first through-hole and the second through-hole be arranged so as to have an impedance-matched pseudo-coaxial structure.

In a fifth aspect of the present invention, in the substrate according to any one of the first to fourth aspect described above, it is preferable that the substrate further comprise a ground pattern (33) for impedance matching, which is electrically connected to the second through-hole.

In a sixth aspect of the present invention, in the substrate according to the fifth aspect described above, it is preferable that the ground pattern be provided at least one layer inside the substrate.

In a seventh aspect of the present invention, in the substrate according to any one of the first to sixth aspect described above, it is preferable that the electrode pads (LC1) are formed at both ends of the first through-hole.

In an eighth aspect of the present invention, in the substrate according to any one of the first to seventh aspect described above, it is preferable that the substrate further comprise a plurality of third through-holes (32) to which a non-high-frequency signal different from the high-frequency signal is transmitted where a distance between the first through-holes be different from a distance between the third through-holes.

A ninth aspect of the present invention is an antenna module (1) including an antenna substrate (10) on which an antenna (11) is formed, a high-frequency integrated circuit (20) that processes high-frequency signals, and the substrate (30) according to any one of the first to eighth aspects described above. The antenna substrate and the high-frequency integrated circuit are mounted on the first surface and the second surface of the substrate respectively so that at least a portion of the antenna substrate and the high-frequency integrated circuit overlap each other in a plan view, and the antenna substrate and the high-frequency integrated circuit are electrically connected through the first through-hole.

In a tenth aspect of the present invention, in the antenna module according to the ninth aspect described above, it is preferable that the substrate be made of a material having a larger dielectric loss tangent than the material of the antenna substrate.

Effects of the Invention

According to an aspect of the present invention described above, impedance-matched through-holes can be arranged at a higher density than the conventional one.

BEST MODE FOR CARRYING OUT THE INVENTION

Figure 1:
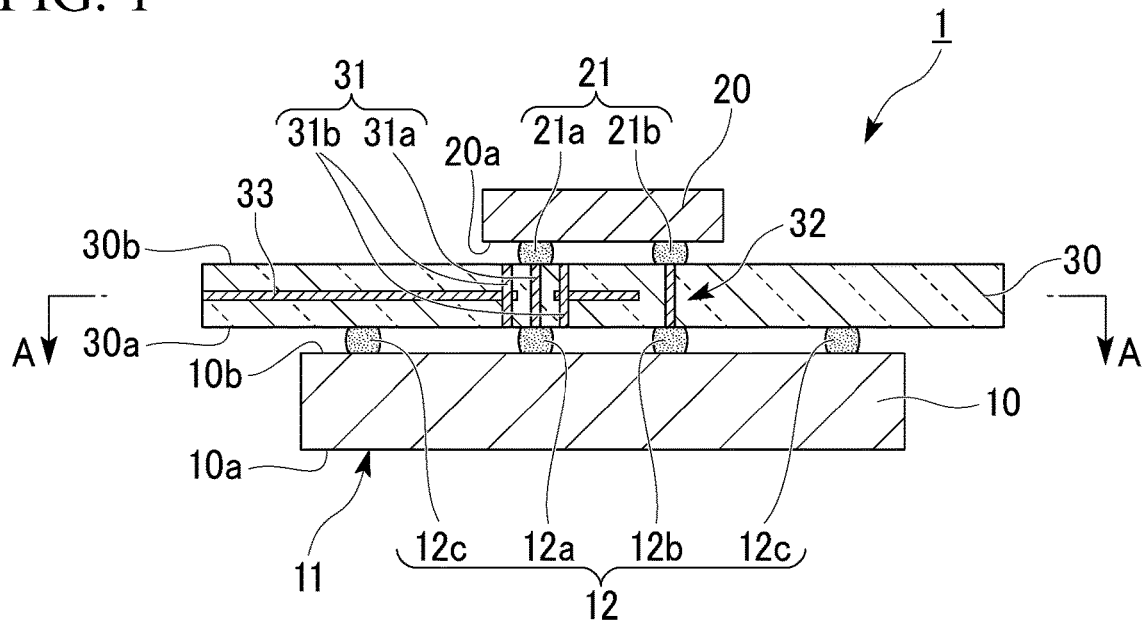
FIG. 1 is a cross-sectional view showing a main structure of an antenna module according to an embodiment of the present invention.

Hereinafter, the substrate and the antenna module according to the embodiment of the present invention will be described in detail with reference to the drawings. In the drawings used in the following description, in order to make the structure easy to understand, each component may be enlarged and shown, and the dimensional ratio of each component is not always the same as the actual one. In addition, the present invention is not limited to the following embodiments.

(Main Structure of Antenna Module)

FIG. 1 is a cross-sectional view showing a main structure of an antenna module according to an embodiment of the present invention. As shown in FIG. 1, the antenna module 1 includes an antenna substrate (high-frequency substrate) 10, an RFIC (high-frequency integrated circuit) 20, and a component mounting substrate 30, and for example, transmits and receives millimeter waves having a frequency of approximately 50 to 70 [GHz] and the like. The antenna module 1 may only transmit a high-frequency signal or may only receive a high-frequency signal.

(Antenna Substrate)

The antenna substrate 10 is a substrate where the antenna 11 is formed therein or on the surface (first surface 10a), and is mounted at a first surface 30a side of the component mounting substrate 30. The antenna substrate 10 is formed by using a material having a small dielectric loss tangent (small loss of high-frequency signal) and favorable transmission characteristics of high-frequency signal. Examples of such a material include fluororesin, liquid crystal polymer (LCP), polyphenylene ether (PPE) resin, low-temperature fired ceramics, and the like. The antenna substrate 10 has a minimum area (area in a plan view) necessary for reducing the cost.

The antenna 11 is, for example, an array antenna in which a plurality of radiation elements (not shown) are two-dimensionally arranged on the first surface 10a of the antenna substrate 10. In addition, as the antenna 11, a linear antenna, a flat antenna, a microstrip antenna, a patch antenna, or another antenna can be used other than the array antenna. The antenna 11 is not particularly limited as long as a structure thereof can be formed on the surface (first surface 10a) or inside of the antenna substrate 10.

A plurality of metal terminals 12 are provided on the second surface 10b of the antenna substrate 10. As the material of the metal terminal 12, for example, a metal such as solder can be used. The metal terminal 12 includes a plurality of connection metal terminals 12a, a plurality of connection metal terminals 12b, and a plurality of fixing metal terminals 12c.

The connection metal terminal 12a electrically connects the antenna substrate 10 and the pseudo-coaxial structure through-hole 31 (details thereof will be described later) formed in the component mounting substrate 30. The connection metal terminal 12b electrically connects the antenna substrate 10 and the non-high-frequency signal through-hole 32 (details thereof will be described later) formed in the component mounting substrate 30. The fixing metal terminal 12c fixes the antenna substrate 10 to the component mounting substrate 30 without being electrically connected to the circuit formed on the component mounting substrate 30.

The connection metal terminals 12a are arranged in the same manner as the pseudo-coaxial structure through-holes 31 of the component mounting substrate 30 when viewed in a plan view. That is, when the antenna substrate 10 and the component mounting substrate 30 are aligned, each of the connection metal terminals 12a of the antenna substrate 10 is arranged so as to overlap each of the pseudo coaxial structure through-holes 31 of the component mounting substrate 30 on a one-to-one basis. For example, the connection metal terminals 12a are arranged with a pitch of approximately 0.1 to 0.5 [mm]. As a result, the transmission distance of the high-frequency signal can be minimized, and thereby, the transmission loss of the high-frequency signal can be minimized. The connection metal terminals 12b may also be arranged in the same manner as the non-high-frequency signal through-holes 32 of the component mounting substrate 30 when viewed in a plan view.

In a state where the antenna substrate 10 is mounted on the component mounting substrate 30, the connection metal terminal 12a is desirable to have a structure that is not covered with resin or the like, and the connection metal terminal 12b and the fixing metal terminal 12c are desirable to have a structure covered with resin. By not covering the connection metal terminal 12a with resin or the like, the transmission loss of the high-frequency signal can be reduced. By covering the connection metal terminal 12b and the fixing metal terminal 12c with a resin, the connection portion between the antenna substrate 10 and the component mounting substrate 30 can be reinforced.

It is desirable that no other component be mounted (or installed) on the antenna substrate 10. This is for reasons such as making the area and thickness of the antenna substrate 10 as small as possible and ensuring reliability. However, if necessary, other components may be mounted on the antenna substrate 10.

(RFIC)

The RFIC 20 is an integrated circuit that processes high-frequency signals, and is mounted on a second surface 30b side of the component mounting substrate 30. The RFIC 20 is electrically connected to the antenna substrate 10 via a pseudo-coaxial structure through-hole 31, a non-high-frequency signal through-hole 32, and metal terminals 12 (connection metal terminals 12a and 12b) of the component mounting substrate 30. For example, the RFIC 20 performs reception processing of a high-frequency signal output from the antenna substrate 10 and outputs a reception signal having a frequency lower than that of the high-frequency signal from an output terminal (not shown). For example, the RFIC 20 performs transmission processing of a transmission signal input from an input terminal (not shown), and outputs a high-frequency signal having a frequency higher than that of the transmission signal to the antenna substrate 10.

A plurality of metal terminals 21 are provided on the first surface 20a of the RFIC 20. As the material of the metal terminal 21, for example, a metal such as solder (SnAgCu solder or the like), gold, silver, copper or the like can be used. The metal terminal 21 includes a plurality of metal terminals 21a and a plurality of metal terminals 21b.

The metal terminal 21a electrically connects the RFIC 20 and the pseudo-coaxial structure through-hole 31 of the component mounting substrate 30. The metal terminal 21b electrically connects the RFIC 20 and the non-high-frequency signal through-hole 32 of the component mounting substrate 30. Bonding of the metal terminal 21a and the pseudo-coaxial structure through-hole 31 and bonding of the metal terminal 21b and the non-high-frequency signal through-hole 32 are performed by, for example, solder bonding; however, may be performed by using other bonding methods of ultrasonic bonding, pressure bonding, and the like.

The metal terminals 21a are arranged in the same manner as the pseudo-coaxial structure through-holes 31 of the component mounting substrate 30 when viewed in a plan view. That is, when the RFIC 20 and the component mounting substrate 30 are aligned, each of the metal terminals 21a of the RFIC 20 is arranged so as to overlap each of the pseudo-coaxial structure through-holes 31 of the component mounting substrate 30 on a one-to-one basis. For example, the metal terminals 21a are arranged with a pitch of approximately 0.1 to 0.5 [mm], similarly to the connection metal terminals 12a of the antenna substrate 10. As a result, the transmission distance of the high-frequency signal can be minimized, and thereby, the transmission loss of the high-frequency signal can be minimized. The metal terminals 21b may also be arranged in the same manner as the non-high-frequency signal through-holes 32 of the component mounting substrate 30 when viewed in a plan view.

In a state where the RFIC 20 is mounted on the component mounting substrate 30, the metal terminal 21a is desirable to have a structure that is not covered with a resin or the like. For example, it is desirable that the space between the first surface 20a of the RFIC 20 and the second surface 30b of the component mounting substrate 30 be not sealed by an underfill. By not covering the metal terminal 21a with resin or the like, the transmission loss of the high-frequency signal can be reduced.

(Component Mounting Substrate)

The component mounting substrate 30 is a substrate on which components such as the antenna substrate 10 and the RFIC 20 are mounted. The component mounting substrate 30 is made of a material having larger dielectric loss tangent than dielectric loss of the antenna substrate 10. Examples of such a material include an inexpensive material (for example, epoxy, polyimide, and the like) that has been generally used conventionally as a material for a rigid substrate or a flexible substrate.

The thickness of the component mounting substrate 30 is preferably, for example, approximately 1.6 [mm] or less. In order to form fine through-holes, it is advantageous that the thickness of the component mounting substrate 30 is small. For example, when forming a fine through-hole having a diameter of approximately 0.1 [mm], it is desirable to use a component mounting substrate 30 having a thickness of approximately 0.8 [mm] or less.

The component mounting substrate 30 is formed with a pseudo-coaxial structure through-hole 31 and a non-high-frequency signal through-hole (third through-hole) 32 extending from the first surface 30a to the second surface 30b of the component mounting substrate 30. In FIG. 1, for simplification of the illustration, one pseudo-coaxial structure through-hole 31 and one non-high-frequency signal through-hole 32 are shown; however, a plurality of these may be provided.

The pseudo-coaxial structure through-hole 31 is a through-hole provided for transmitting a high-frequency signal. The pseudo-coaxial structure through-hole 31 is composed of two high-frequency signal through-holes (first through-hole) 31a and at least three ground through-holes (second through-hole) 31b arranged side by side with respect to the two high-frequency signal through-holes 31a (see FIG. 2). In the three ground through-holes 31b, one ground through-hole 31b is arranged in the region between the two high-frequency signal through-holes 31a (see FIG. 3 below). Regarding the other two ground through-holes 31b, in a region other than the region between the high-frequency signal through-holes 31a, one ground through-hole 31b is arranged side by side with respect to one high-frequency signal through-hole 31a, and the other ground through-hole 31b is arranged side by side with respect to the other high-frequency signal through-hole 31a.

The high-frequency signal through-hole 31a is a through hole to which a high-frequency signal is transmitted. The ground through-hole 31b is a through hole having a ground potential (reference potential). The high-frequency signal through-holes 31a and the ground through-holes 31b are arranged so that the pseudo-coaxial structure through-holes 31 have a pseudo-coaxial structure in which impedance matching is performed.

Here, if only one ground through-hole 31b is arranged side by side with respect to one high-frequency signal through-hole 31a, the effect of confining the electric field of the high-frequency signal is insufficient and favorable characteristics cannot be obtained. Therefore, in the present embodiment, two ground through-holes 31b (one is shared by the pseudo-coaxial structure through-holes 31A and 31B) are arranged side by side with one high-frequency signal through-hole 31a, and thereby, the transmission loss of the high-frequency signal is reduced.

The number of ground through-holes 31b arranged side by side with respect to the high-frequency signal through-holes 31a may be three or more. However, when the number of ground through-hole 31b increases, similarly to the through-holes of the pseudo-coaxial structure described in the prior art, the structure is not suitable for narrowing the pitch. In addition, the cost increases and the distance between the ground through-holes 31b becomes narrow so that issues such as damage are likely to occur. Therefore, the number of ground through-holes 31b is preferably as small as possible (two or more) as long as an impedance-matched pseudo-coaxial structure can be obtained.

Here, the impedance-matched pseudo-coaxial structure refers to a structure that when considering a coaxial structure with the high-frequency signal through-hole 31a as the central conductor, on or near a virtual circle in which the ground conductor surrounding the central conductor should be originally arranged, a ground through-hole 31b is arranged. The displacement of the ground through-hole 31b from the virtual circle is allowed as long as the impedance error is in the range of approximately ±10 [Ω], for example.

The non-high-frequency signal through-hole 32 is a through-hole provided for transmitting a low frequency signal having a frequency lower than that of the high-frequency signal, supplying power, connecting to the ground, and the like. Since the transmission loss of a low frequency signal or the like due to impedance mismatch is sufficiently smaller than the transmission loss of a high-frequency signal, the non-high-frequency signal through-hole 32 is not regarded as a pseudo-coaxial structure such as the pseudo coaxial structure through-hole 31.

Here, the diameter of the non-high-frequency signal through-hole 32 is the same as (or approximately the same as) the diameter of the high-frequency signal through-hole 31a and the ground through-hole 31b. The diameter of the high-frequency signal through-hole 31a and the ground through-holes 31b, and the non-high-frequency signal through-holes 32 are preferably 0.15 [mm] or less, for example.

The high-frequency signal through-holes 31a and ground through-holes 31b, and the non-high-frequency signal through-holes 32 are preferably formed by any of conductor pins, conductor wires, metal plating, conductive paste, and the like, but are not limited thereto. Examples of the conductor used for the high-frequency signal through-hole 31a and the ground through-hole 31b, and the non-high-frequency signal through-hole 32 include metals such as copper, silver, gold and alloys, and carbon. The shapes of the high-frequency signal through-holes 31a and ground through-holes 31b, and the non-high-frequency signal through-holes 32 are not particularly limited, and examples thereof include pin-like, linear, layered, particulate, scaly, fibrous, and nanotubes.

Furthermore, a ground pattern 33 is formed on the component mounting substrate 30. The ground pattern 33 is an inner layer pattern of the component mounting substrate 30, and is electrically connected to the ground through-hole 31b. By providing the ground pattern 33, the ground through-hole 31b of the pseudo-coaxial structure through-hole 31 can be reinforced and favorable impedance matching can be realized.

Figure 2:
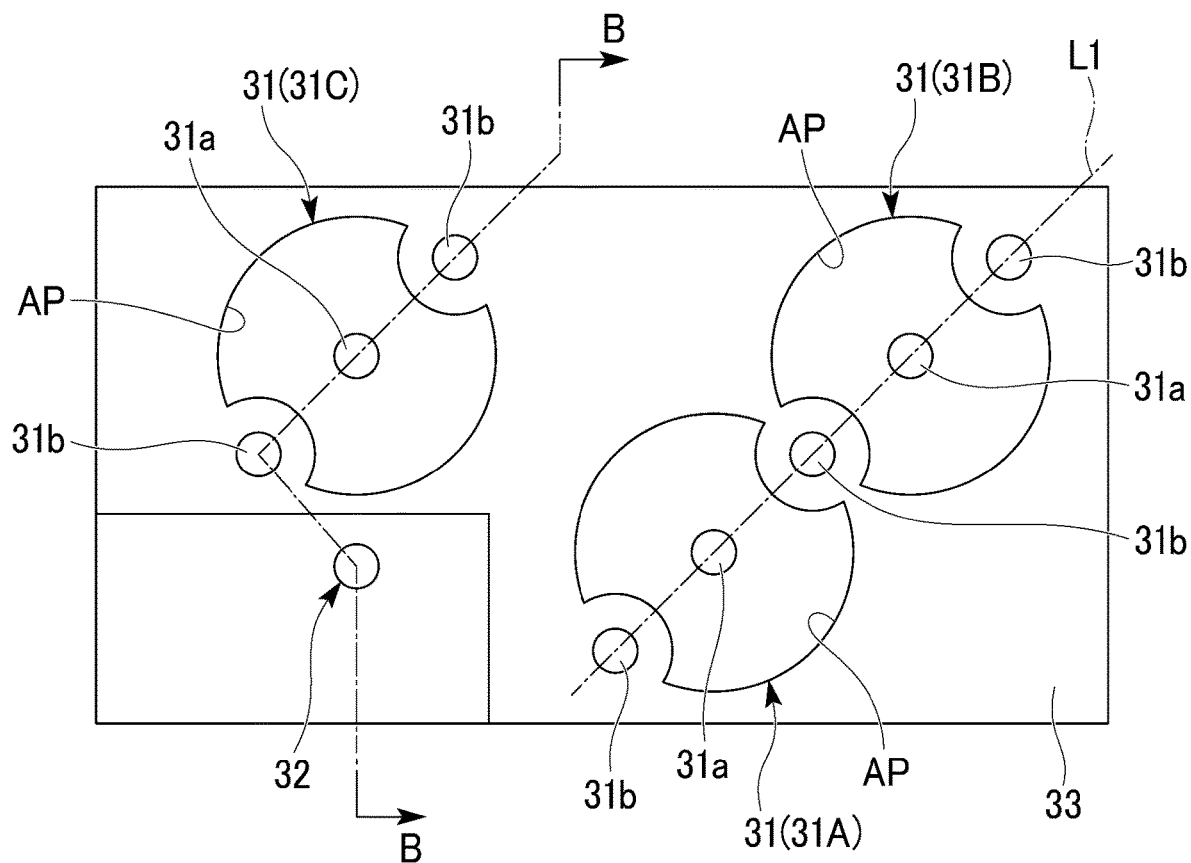
FIG. 2 is a cross-sectional arrow view taken along the line A-A of FIG. 1.

FIG. 2 is a cross-sectional arrow view taken along the line A-A of FIG. 1. Note that FIG. 1 is, for example, a cross-sectional arrow view taken along line B-B in FIG. 2. In the example shown in FIG. 2 of the through-holes formed in the component mounting substrate 30, three pseudo-coaxial structure through-holes 31 (31A, 31B, and 31C) and one non-high-frequency signal through-hole 32 are shown. The pseudo-coaxial structure through-holes 31A and 31B are arranged close to each other in order to narrow the pitch. On the other hand, the pseudo-coaxial structure through-holes 31C are arranged at positions separated to some extent from the pseudo-coaxial structure through-holes 31A and 31B.

As shown in FIG. 2, in the ground pattern 33, an opening AP is formed in which the perimeter of the high-frequency signal through-holes 31a provided in each of the pseudo-coaxial structure through-holes 31A, 31B, and 31C is hollowed out in a substantially circular shape. The ground through-holes 31b provided in each of the pseudo-coaxial structure through-holes 31A, 31B, and 31C are electrically connected to the ground pattern 33. In addition, the non-high-frequency signal through-hole 32 is insulated from the ground pattern 33.

As described above, the high-frequency signal through-holes 31a and the ground through-holes 31b provided in each of the pseudo-coaxial structure through-holes 31A, 31B, and 31C are arranged to have an appropriate distance such that each of the pseudo-coaxial structure through-holes 31A, 31B, and 31C are impedance-matched. For example, when the relative permittivity of the component mounting substrate 30 is approximately "4", the diameter of the high-frequency signal through-hole 31a is 0.15 [mm], and the characteristic impedance is 50 [Ω]. The distance between the high-frequency signal through-hole 31a and the ground through-hole 31b is set to approximately 0.375 [mm].

Furthermore, by providing the ground pattern 33, as described above, the ground through-hole 31b can be reinforced and favorable impedance matching can be realized. Therefore, the size of the opening AP formed in the ground pattern 33 can be designed by the same method for the distance between the high-frequency signal through-hole 31a and the ground through-hole 31b. For example, the distance between the high-frequency signal through-hole 31a and the inner peripheral edge of the opening AP is set to approximately 0.375 [mm] (the inner diameter of the opening AP is approximately 0.75 [mm]).

Here, when forming the through-holes (high-frequency signal through-holes 31a and ground through-hole 31b), if the through-holes are to be formed is too close to the other through-hole, damage such as crack in the substrate may occur in some cases. Therefore, the distance between the through-holes needs to be a certain distance or more (for example, 0.2 [mm] or more).

As shown in FIG. 2, the pseudo-coaxial structure through-holes 31A and 31B are arranged close to each other in order to narrow the pitch, and the ground through-holes 31b of the pseudo-coaxial structure through-holes 31A and the ground through-holes 31b of the pseudo-coaxial structure through-holes 31B may be arranged so as to be close to each other (for example, less than 0.2 [mm]). In the present embodiment, the ground through-holes 31b arranged in the region between the two high-frequency signal through-holes 31a are shared by the pseudo-coaxial structure through-holes 31A and 31B so that the above-described proximity does not occur.

In the example shown in FIG. 2, when the pseudo-coaxial structure through-holes 31A and 31B arranged close to each other are collectively viewed, the pseudo-coaxial structure through-holes 31A and 31B have two high-frequency signal through-holes 31a and three ground through-holes 31b arranged side by side with these high-frequency signal through-holes 31a. The three ground through-holes 31b are arranged on a straight line L1 so that two adjacent ground through-holes 31b sandwich one high-frequency signal through-hole 31a. The straight line L1 is a straight line connecting the centers of the high-frequency signal through-holes 31a of the pseudo-coaxial structure through-holes 31A and 31B.

The ground through-holes 31b arranged in the region between the two high-frequency signal through-holes 31a are arranged at positions that are substantially equidistant from each of the high-frequency signal through-holes 31a. Here, the "substantially equidistant" is a distance that takes into account manufacturing errors during manufacturing of the component mounting substrate 30. That is, even if the distances are not completely equidistant, if the difference in distance is approximately a manufacturing error, the ground through-holes 31b arranged in the region between the high-frequency signal through-holes 31a can be arranged at a position equidistant for each of the high-frequency signal through-holes 31a.

As described above, the ground through-holes 31b arranged in the region between the high-frequency signal through-holes 31a are arranged at positions on the straight line L1 at substantially equidistant from each of the high-frequency signal through-holes 31a. Such an arrangement can minimize the effect on the properties of mutually exerted between adjacent high-frequency signal through-hole 31a.

Figure 3:
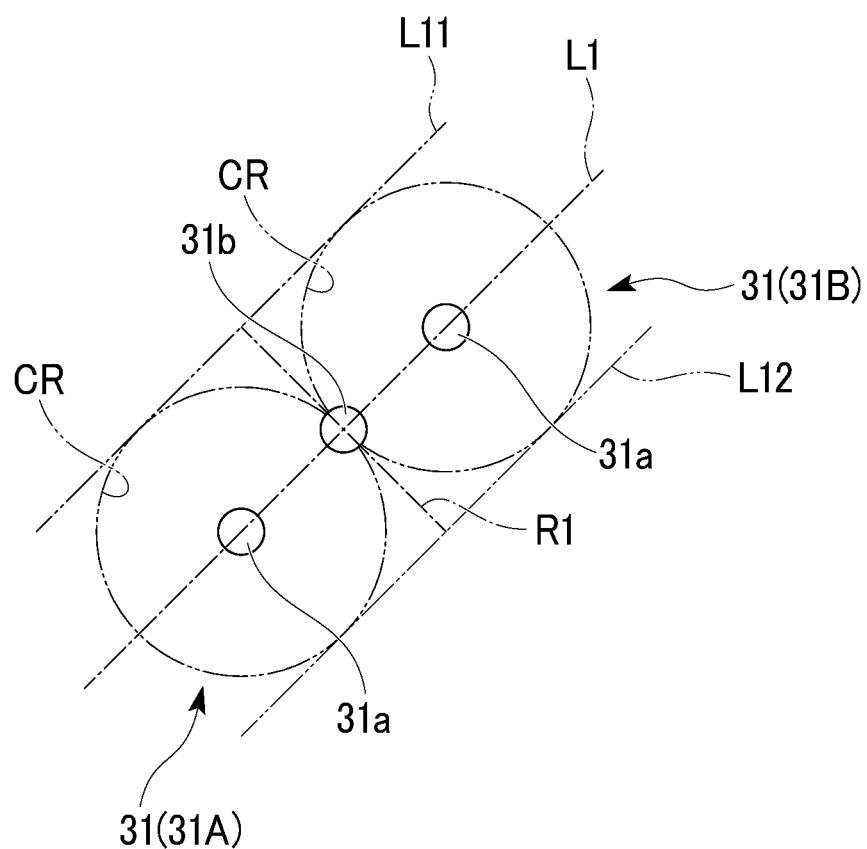
FIG. 3 is a plan view describing a region between high-frequency signal through-holes according to an embodiment of the present invention.

FIG. 3 is a plan view illustrating a region between high-frequency signal through-holes according to an embodiment of the present invention. As shown in FIG. 3, the region R1 between the high-frequency signal through-hole 31a of the pseudo-coaxial structure through-hole 31A and the high-frequency signal through-hole 31a of the pseudo-coaxial structure through-hole 31B is a region shown by a line segment in the figure. The region R1 is a region where a straight line orthogonal to the straight line L1 is partitioned by parallel straight lines L11 and L12 circumscribing two circles CR. The circles are respectively centered on the high-frequency signal through-holes 31a of the pseudo-coaxial structure through-holes 31A and 31B, and each center of the ground through-holes 31b arranged side by side in the respective high-frequency signal through-holes 31a is regarded as a portion of the circumference of the circles.

That is, in the present embodiment, the pseudo-coaxial structure through-holes 31A and 31B are designed under the following conditions. One of three ground through-holes 31b of the pseudo coaxial structure through-holes 31A and 31B is arranged in the region R1 between the high-frequency signal through-holes 31a. In the other two of the ground through-holes 31b, in the region other than the region R1, one of the ground through-hole 31b is arranged side by side with respect to one of the high-frequency signal through-hole 31a, the other of the ground through-hole 31b is arranged side by side with respect to the other of the first through-hole 31a.

The arrangement of the ground through-holes 31b can be changed as long as the above conditions are satisfied and impedance matching is performed. For example, in the example shown in FIG. 2, all three ground through-holes 31b are arranged on the straight line L1. However, for example, the ground through-hole 31b arranged in the region R1 between the two high-frequency signal through-holes 31a may not be arranged on the straight line L1 as long as it is arranged in the region R1. Further, the other ground through-holes 31b may not be arranged on the straight line L1.

Figure 4:
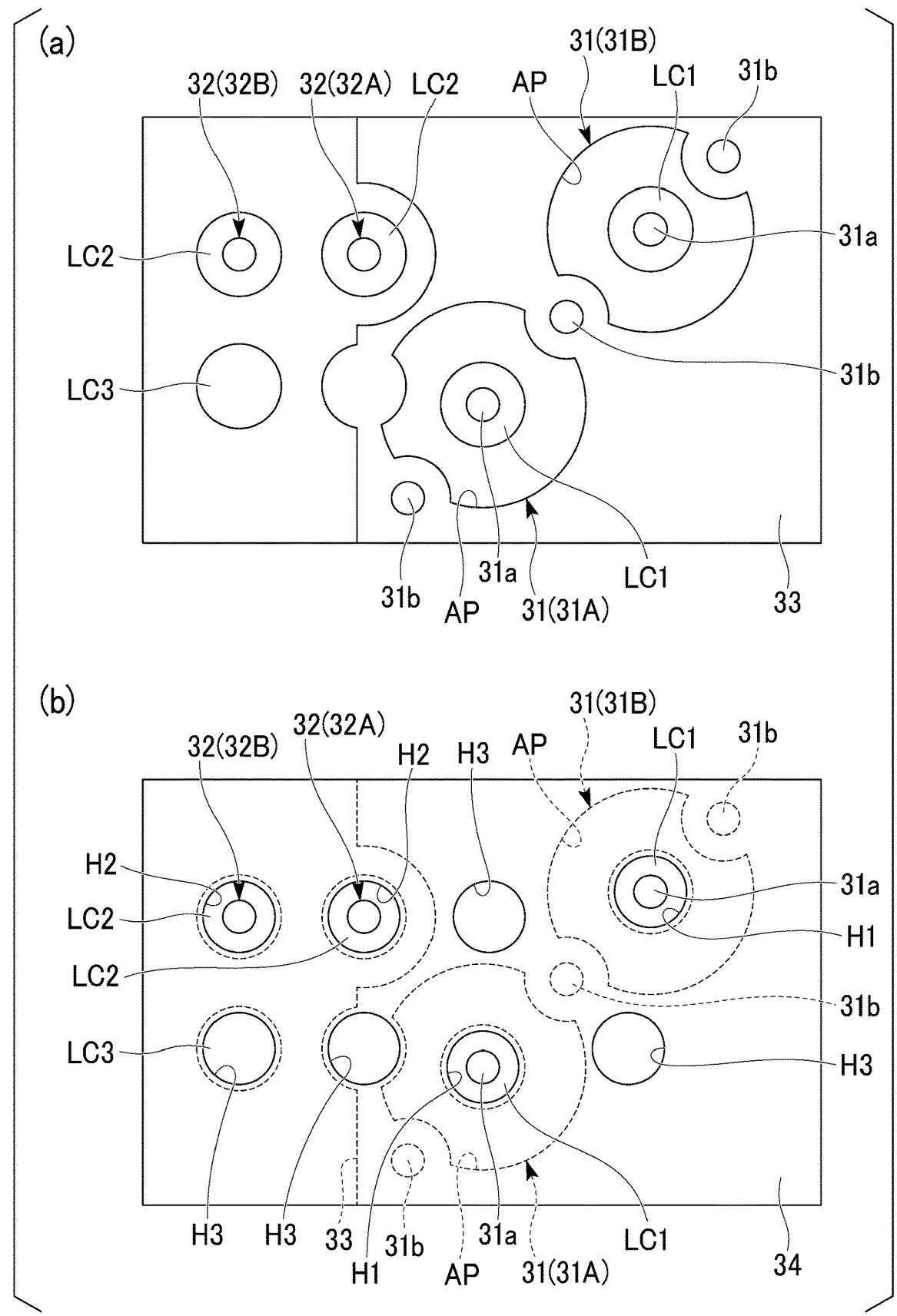
FIG. 4 is a diagram showing a surface of a component mounting substrate according to an embodiment of the present invention.

FIG. 4 is a diagram showing the surface of the component mounting substrate according to the embodiment of the present invention. Part (a) of FIG. 4 is a plan view showing a pattern formed on the second surface 30b side of the component mounting substrate 30, and part (b) of FIG. 4 is a plan view showing a state in which a solder resist is formed on the pattern. Although FIG. 4 shows the structure on the second surface 30b side of the component mounting substrate 30, the first surface 30a side of the component mounting substrate 30 has the similar structure.

In addition, in FIG. 4, for the sake of convenience, the pseudo-coaxial structure through-holes 31A and 31B are shown that have the same reference numerals as those of the pseudo-coaxial structure through-holes 31A and 31B shown in FIG. 2. However, note that the pseudo-coaxial structure through-holes 31A and 31B shown in FIG. 4 and the pseudo-coaxial structure through-holes 31A and 31B shown in FIG. 2 are different from each other (formed at different positions on the component mounting substrate 30).

In the example shown in part (a) of FIG. 4, two pseudo-coaxial structure through-holes 31 (31A and 31B) and two non-high-frequency signal through-holes 32 (32A and 32B) are illustrated. The ground through-holes 31b of the pseudo-coaxial structure through-holes 31A and 31B are connected to the ground pattern 33 formed on the second surface 30b of the component mounting substrate 30. On the other hand, the non-high-frequency signal through-holes 32A and 32B are insulated from the ground pattern 33.

A land conductor LC1 (electrode pad) is formed around the high-frequency signal through-holes 31a of the pseudo-coaxial structure through-holes 31A and 31B, and a land conductor LC2 is formed around the non-high-frequency signal through-holes 32A and 32B. That is, the high-frequency signal through-holes 31a and the non-high-frequency signal through-holes 32A and 32B of the pseudo-coaxial structure through-holes 31A and 31B have a so-called pad-on-via structure. With such a pad-on-via structure, by making the transmission distance of the high-frequency signal between the antenna substrate 10 and RFIC 20 the shortest, the transmission loss of the high-frequency signal can be minimized.

As shown in part (a) of FIG. 4, a circular conductor (hereinafter, for convenience, referred to as a land conductor LC3) is also formed on the second surface 30b of the component mounting substrate 30. The land conductor LC3 has approximately the same size as the land conductors LC1 and LC2, and is insulated from the ground pattern 33. By the land conductor LC3, for example, the RFIC 20 mounted on the second surface 30b of the component mounting substrate 30 can be fixed.

As shown in part (b) of FIG. 4, a solder resist 34 is formed on the second surface 30b of the component mounting substrate 30. The solder resist 34 is formed with holes H1 for exposing high-frequency signal through-holes 31a (including a portion of the land conductor LC1) of the pseudo-coaxial structure through-holes 31A and 31B to the outside. The diameter of the land conductor LC1 is, for example, approximately 0.3 [mm], and the diameter of the hole H1 is, for example, approximately 0.2 [mm].

The solder resist 34 is formed with holes H2 for exposing the non-high-frequency signal through-holes 32A and 32B (including a portion of the land conductor LC2) to the outside. In addition, the solder resist 34 is formed with holes H3 for exposing a portion of the land conductor LC3 and a portion of the ground pattern 33 to the outside. The diameters of the land conductors LC2 and LC3 are, for example, approximately 0.3 [mm], and the diameters of the holes H2 and H3 are, for example, approximately 0.2 [mm].

Here, the portions exposed to the outside via the holes H1, H2, and H3 are used as mounting lands for mounting the RFIC 20 on the second surface 30b of the component mounting substrate 30. These mounting lands are basically arranged at a constant pitch in the plane of the second surface 30b of the component mounting substrate 30. However, as shown in part (b) of FIG. 4, the pitch of the mounting lands related to the holes H1 may be different from the pitch of the mounting lands related to the holes H2 and H3.

That is, the distance between the non-high-frequency signal through-holes 32A and 32B can be set to be different from the distance between the high-frequency signal through-holes 31a of the pseudo-coaxial structure through-holes 31A and 31B. This is because it may be desirable to adjust the distance between the high-frequency signal through-hole 31a and the ground through-hole 31b in order to match the impedance of the pseudo-coaxial structure through-holes 31A and 31B.

The antenna substrate 10 is mounted on the first surface 30a of the component mounting substrate 30 such that each of the connection metal terminals 12a is positioned so as to overlap one-to-one with each of the high-frequency signal through-holes 31a of the component mounting substrate 30 in a plan view, and each of the connection metal terminals 12b is positioned so as to overlap one-to-one with each of non-high-frequency signal through-holes 32 of the component mounting substrate 30 in a plan view. The RFIC 20 is mounted on the second surface 30b of the component mounting substrate 30 such that each of the metal terminals 21a is positioned so as to overlap one-to-one with each of the high-frequency signal through-holes 31a of the component mounting substrate 30 in a plan view, and each of the metal terminals 21b is positioned so as to overlap one-to-one with each of non-high-frequency signal through-holes 32 of the component mounting substrate 30 in a plan view.

The antenna substrate 10 and the RFIC 20 are mounted on the first surface 30a and the second surface 30b of the component mounting substrate 30, respectively, so that the entire RFIC 20 overlaps the antenna substrate 10 when viewed in a plan view, and the antenna substrate 10 and the RFIC 20 are electrically connected via a high-frequency signal through-hole 31a and a non-high-frequency signal through-hole 32. The antenna substrate 10 and the RFIC 20 may be at least partially overlapped when viewed in a plan view, and may be electrically connected via a high-frequency signal through-hole 31a provided in the overlapped portion.

As described above, the antenna module 1 of the present embodiment includes a component mounting substrate 30 provided with two pseudo-coaxial structure through-holes 31A and 31B arranged close to each other. When the pseudo-coaxial structure through-holes 31A and 31B of the component mounting substrate 30 are collectively viewed, the pseudo-coaxial structure through-holes 31A and 31B have two high-frequency signal through-holes 31a and at least three ground through-holes 31b arranged side by side with respect to the high-frequency signal through-holes 31a. In the three ground through-holes 31b, one ground through-hole 31b is arranged in the region R1 between the two high-frequency signal through-holes 31a. Regarding the other two ground through-holes 31b, in a region other than the region R1 one ground through-hole 31b is arranged side by side with respect to one high-frequency signal through-hole 31a, and the other ground through-hole 31b is arranged side by side with respect to the other high-frequency signal through-hole 31a.

With such a structure, the ground through-hole 31b arranged in the region R1 between the high-frequency signal through-hole 31a of the pseudo-coaxial structure through-hole 31A and the high-frequency signal through-hole 31a of the pseudo coaxial structure through-hole 31B is shared by the pseudo-coaxial structural through-holes 31A and 31B. Accordingly, the impedance-matched pseudo-coaxial structure through-holes 31 can be arranged at a higher density than the conventional one. Furthermore, by sharing the ground through-holes 31b arranged in the region R1 with the pseudo-coaxial structure through-holes 31A and 31B, the number of ground through-holes 31b can be reduced by one, so that the cost thereof can be reduced.

First Modification Example

Figure 5:
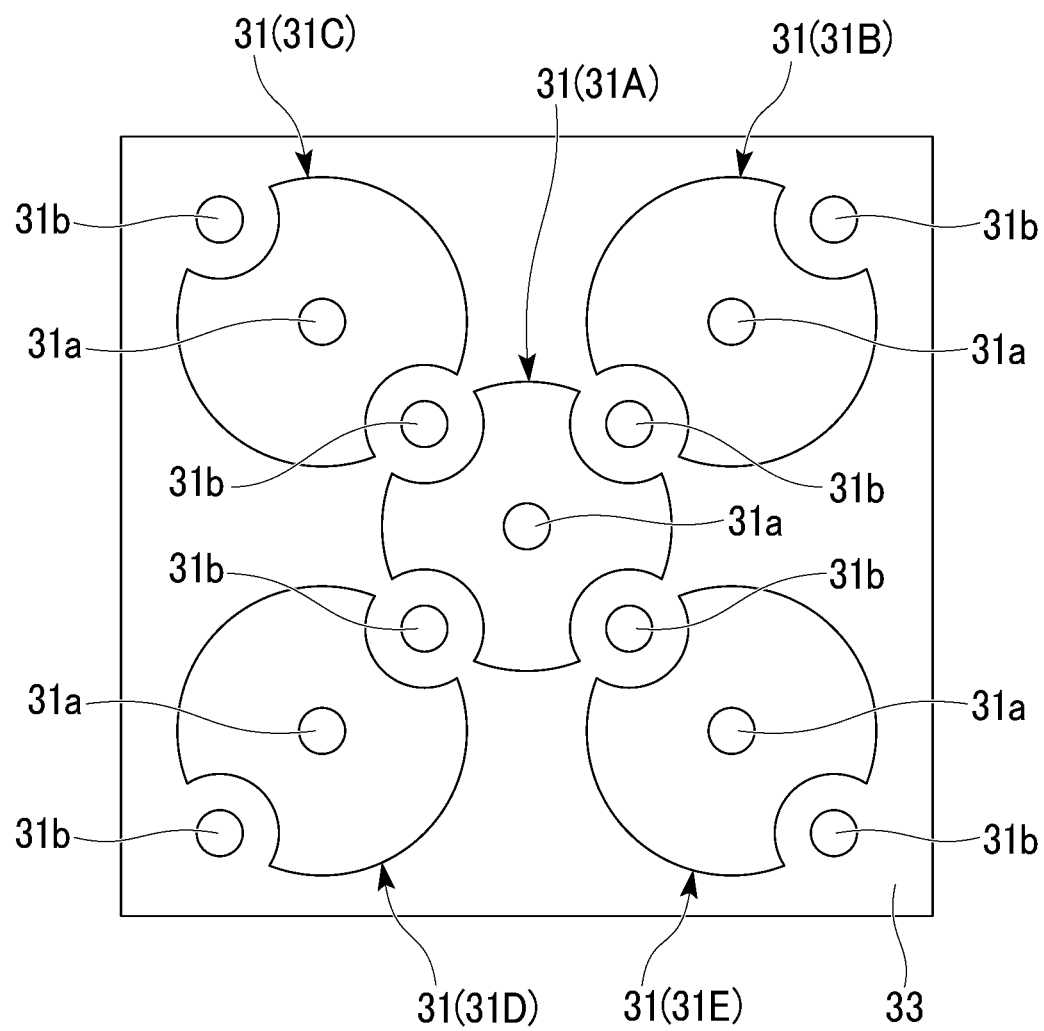
FIG. 5 is a cross-sectional view showing a component mounting substrate according to a first modification example.

FIG. 5 is a cross-sectional view showing a component mounting substrate according to the first modification example. The cross-sectional view shown in FIG. 5 corresponds to the cross-sectional view taken along the line A-A of FIG. 1. In addition, in FIG. 5, the same reference numerals are given to the same structures as those shown in FIG. 2. In the example shown in FIG. 2, for the sake of simplicity, an example in which two pseudo-coaxial structure through-holes 31 (31A and 31B) are arranged close to each other has been described. However, the number of pseudo-coaxial structure through-holes 31 arranged close to each other may be three or more.

In the example shown in FIG. 5, four pseudo-coaxial structure through-holes 31 (31B, 31C, 31D, and 31E) are arranged close to one pseudo-coaxial structure through-hole 31 (31A). In the present example, the ground through-holes 31b arranged in the region R1 (not shown) between the high-frequency signal through-holes 31a of the pseudo-coaxial structure through-holes 31A and 31B are shared by the pseudo coaxial structure through-holes 31A and 31B. In addition, the ground through-hole 31b arranged in the region R1 (not shown) between the high-frequency signal through-holes 31a of the pseudo coaxial structure through-holes 31A and 31C is shared by the pseudo coaxial structure through-holes 31A and 31C.

Similarly, the ground through-holes 31b arranged in the region R1 (not shown) between the high-frequency signal through-holes 31a of the pseudo coaxial structure through-holes 31A and 31D are shared by the pseudo coaxial structure through-holes 31A and 31D. Furthermore, the ground through-hole 31b arranged in the region R1 (not shown) between the high-frequency signal through-holes 31a of the pseudo coaxial structure through-holes 31A and 31E is shared by the pseudo coaxial structure through-holes 31A and 31E.

Second Modification Example

Figure 6:
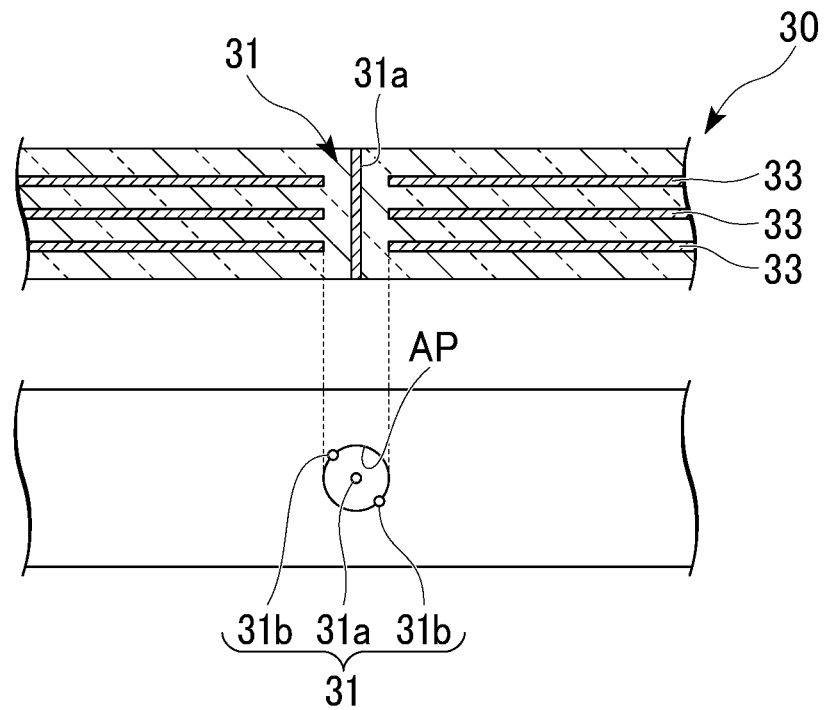
FIG. 6 is a cross-sectional view showing a component mounting substrate according to a second modification example.

FIG. 6 is a cross-sectional view showing a component mounting substrate according to the second modification example. Note that, in FIG. 6, the antenna substrate 10 and the RFIC 20 are not shown, and only the portion of the component mounting substrate 30 on which the pseudo-coaxial structure through-hole 31 is formed and its periphery are shown. Furthermore, in FIG. 6, the same reference numerals are given to the same structures as those shown in FIG. 1.

As shown in FIG. 6, in the present modification example, a ground pattern 33 having a plurality of layers (three layers in the example shown in FIG. 6) is formed in the component mounting substrate 30. Each ground pattern 33 is formed with an opening AP in which the periphery of the high-frequency signal through-hole 31a provided in each of the pseudo-coaxial structure through-holes 31 is hollowed out in a substantially circular shape. Furthermore, each ground pattern 33 is electrically connected to the ground through-hole 31b of the pseudo-coaxial structure through-hole 31.

As described above, in the present modification example, the ground through-hole 31b of the pseudo-coaxial structure through-hole 31 is reinforced by the ground pattern 33 of a plurality of layers (three layers) formed in the component mounting substrate 30. Thereby, it is possible to realize better impedance matching than the above-described embodiment (the ground pattern 33 in the component mounting substrate 30 is one layer).

Third Modification Example

Figure 7:
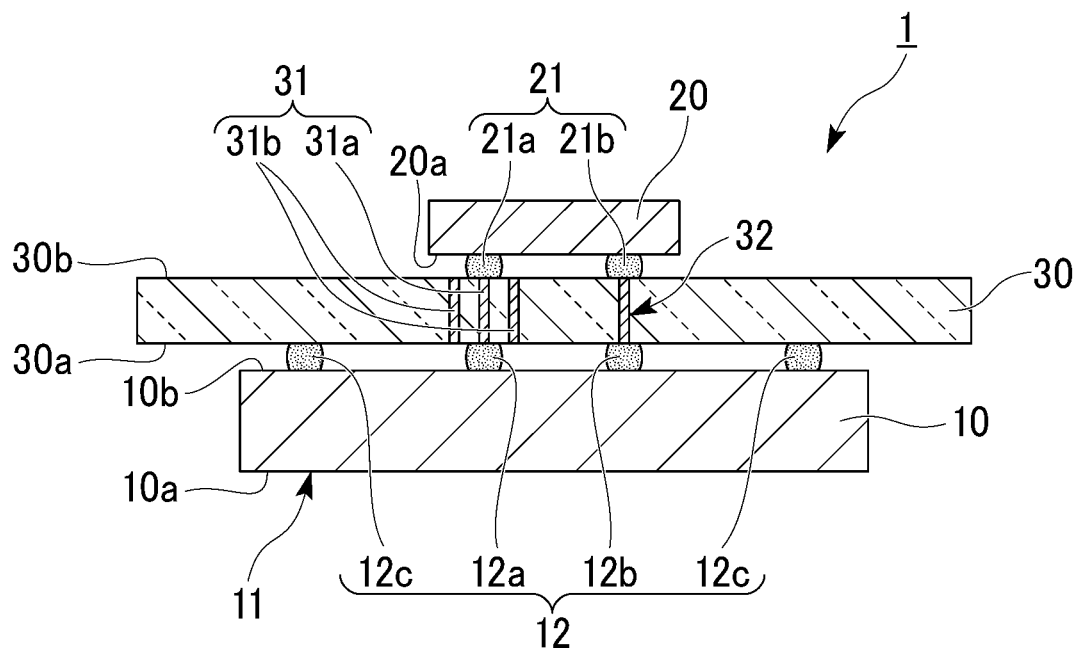
FIG. 7 is a cross-sectional view showing an antenna module according to a third modification example.

FIG. 7 is a cross-sectional view showing an antenna module according to a third modification example. In FIG. 7, the same reference numerals are given to the structures similar to those shown in FIG. 1. The difference between the antenna module 1 according to the present modification example and the antenna module 1 shown in FIG. 1 is that the ground pattern 33 in the component mounting substrate 30 is omitted.

It is desired that a ground pattern 33 in the component mounting substrate 30 be provided in order to reinforce the ground through-hole 31b of the pseudo-coaxial structure through-holes 31. However, if it is not necessary to reinforce the ground through-hole 31b of the pseudo-coaxial structure through-hole 31, the ground pattern 33 can be omitted as shown in FIG. 7.

Although the embodiments of the present invention have been described above, the present invention is not limited to the above embodiments and can be freely modified within the scope of the present invention.

For example, in the antenna module 1 in the embodiment described above, only the antenna substrate 10 and RFIC 20 are mounted on the component mounting substrate 30. However, components other than the antenna substrate 10 and the RFIC 20 (not shown) may be mounted on the component mounting substrate 30.

In addition, in the above-described embodiment, an example in which the antenna substrate 10 is mounted on the first surface 30a of the component mounting substrate 30 and the RFIC 20 is mounted on the second surface 30b of the component mounting substrate 30 has been described.

However, on the contrary, the RFIC 20 may be mounted on the first surface 30a of the component mounting substrate 30, and the antenna substrate 10 may be mounted on the second surface 30b of the component mounting substrate 30.

DESCRIPTION OF THE REFERENCE SYMBOLS

1: Antenna module
10: Antenna substrate
11: Antenna
20: RFIC
30: Component mounting substrate
30a: First surface
30b: Second surface
31a: High-frequency signal through-hole
31b: Ground through-hole
32: Non-high-frequency signal through-hole
33: Ground pattern
L1: Straight line
LC1: Land conductor
R1: Region

The invention claimed is:

1. A substrate in which a through-hole is formed from a first surface to a second surface which is a surface opposite to the first surface, the substrate comprising:

two first through-holes to which high-frequency signals are transmitted and which are arranged side by side so as to have a predetermined distance;

at least three reference potential second through-holes arranged side by side so as to have an distance smaller than the predetermined distance with respect to the two first through-holes; and a plurality of third through-holes to which non-high-frequency signals different from the high-frequency signals are transmitted, wherein among three of the second through-holes, one of the second through-holes is arranged in a region between the two first through-holes, other two of the second through-holes are arranged in a region other than the region between the first through-holes such that one of the other two second through-holes is arranged side by side with respect to one of the two first through-holes, and the other of the other two second through-holes is arranged side by side with respect to the other of the two first through-holes, and a distance between the first through-holes is different from a distance between the third through-holes.

2. The substrate according to claim 1, wherein the second through-hole arranged in the region between the two first through-holes is arranged at a position substantially equidistant from each of the first through-holes.

3. The substrate according to claim 1, wherein the second through-hole arranged in the region between the two first through-holes is arranged on a straight line connecting the centers of the first through-holes.

4. The substrate according to claim 1, wherein the first through-hole and the second through-hole are arranged so as to have an impedance-matched pseudo-coaxial structure.

5. The substrate according to claim 1, further comprising a ground pattern for impedance matching, which is electrically connected to the second through-hole.

6. The substrate according to claim 5, wherein the ground pattern is provided at least one layer inside the substrate.

7. The substrate according to claim 1, wherein electrode pads are formed at both ends of the first through-hole.

8. An antenna module comprising:

an antenna substrate on which an antenna is formed;

a high-frequency integrated circuit that processes high-frequency signals; and a substrate in which a through-hole is formed from a first surface to a second surface which is a surface opposite to the first surface, the substrate comprising:

two first through-holes to which the high-frequency signals are transmitted and which are arranged side by side so as to have a predetermined distance; and at least three reference potential second through-holes arranged side by side so as to have an distance smaller than the predetermined distance with respect to the two first through-holes, wherein among three of the second through-holes, one of the second through-holes is arranged in a region between the two first through-holes, and other two of the second through-holes are arranged in a region other than the region between the first through-holes such that one of the other two second through-holes is arranged side by side with respect to one of the two first through-holes, and the other of the other two second through-holes is arranged side by side with respect to the other of the two first through-holes, and wherein the antenna substrate and the high-frequency integrated circuit are mounted on the first surface and the second surface of the substrate respectively so that at least a portion of the antenna substrate and the high-frequency integrated circuit overlap each other in a plan view, and the antenna substrate and the high-frequency integrated circuit are electrically connected through the first through-hole.

9. The antenna module according to claim 8, wherein the substrate is made of a material having a larger dielectric loss tangent than the material of the antenna substrate.

10. The antenna module according to claim 8, wherein the second through-hole arranged in the region between the two first through-holes is arranged at a position substantially equidistant from each of the first through-holes.

11. The antenna module according to claim 8, wherein the second through-hole arranged in the region between the two first through-holes is arranged on a straight line connecting the centers of the first through-holes.

12. The antenna module according to claim 8, wherein the first through-hole and the second through-hole are arranged so as to have an impedance-matched pseudo-coaxial structure.

13. The antenna module according to claim 8, further comprising a ground pattern for impedance matching, which is electrically connected to the second through-hole.

14. The antenna module according to claim 13, wherein the ground pattern is provided at least one layer inside the substrate.

15. The antenna module according to claim 8, wherein electrode pads are formed at both ends of the first through-hole.

\* \* \* \* \*